(12) United States Patent
Choi

(10) Patent No.: US 7,338,868 B2
(45) Date of Patent: Mar. 4, 2008

(54) METHOD FOR FORMING GATE OXIDE LAYER IN SEMICONDUCTOR DEVICE

(75) Inventor: Yong Keon Choi, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 160 days.

(21) Appl. No.: 11/024,466

(22) Filed: Dec. 30, 2004

(65) Prior Publication Data

US 2005/0142770 A1  Jun. 30, 2005

(30) Foreign Application Priority Data

Dec. 31, 2003  (KR) .................... 10-2003-0101931

(51) Int. Cl.
*H01L 21/336* (2006.01)

(52) U.S. Cl. .................. 438/279; 257/E27.084

(58) Field of Classification Search ............... 257/279, 257/981, E27.084, E27.098
See application file for complete search history.

(56) References Cited

U.S. PATENT DOCUMENTS

| 6,130,168 A * | 10/2000 | Chu et al. ............... 438/717 |
| 6,602,751 B2 * | 8/2003 | Oohashi .................... 438/275 |
| 6,946,349 B1 * | 9/2005 | Lee et al. ................. 438/275 |
| 7,030,012 B2 * | 4/2006 | Divakaruni et al. ........ 438/652 |
| 7,052,963 B2 * | 5/2006 | Williams et al. ........... 438/268 |
| 2002/0173066 A1 * | 11/2002 | Masuoka ................... 438/60 |
| 2002/0197800 A1 * | 12/2002 | Hashimoto et al. ......... 438/266 |
| 2005/0003618 A1 * | 1/2005 | Kanda ...................... 438/275 |
| 2005/0023604 A1 * | 2/2005 | Kim et al. .................. 257/316 |

* cited by examiner

*Primary Examiner*—Thao P. Le
(74) *Attorney, Agent, or Firm*—Lowe Hauptman Ham & Berner LLP

(57) ABSTRACT

A method for forming gate oxide layers of a semiconductor device including defining a first, a second, and a third device region by forming device isolation regions on a semiconductor substrate. The method also includes forming a sacrificing dielectric layer on the substrate, removing the sacrificing dielectric layer on the first device region by selective etching, and forming a first gate oxide layer by oxidizing the first device region. The method further includes removing the sacrificing dielectric layer on the second and third device regions, forming a second gate oxide layer on the second and third device region by oxidizing the substrate, forming a photoresist pattern exposing the third device region and covering the first and second device regions, and forming a third gate oxide layer by oxidizing the third device region.

18 Claims, 4 Drawing Sheets

METHOD FOR FORMING GATE OXIDE LAYER IN SEMICONDUCTOR DEVICE

This application claims the benefit of Korean Patent Application No. 10-2003-0101931, filed on 31 Dec. 2003, which is hereby incorporated by reference as if fully set forth herein.

BACKGROUND OF THE INVENTION (a) Field of the Invention

The present invention relates to a method for fabricating a semiconductor device and, in particular, to a method for fabricating semiconductor devices having gate oxide films.

(b) Description of the Related Art

As semiconductor devices have been implemented for various applications, different device characteristics are required. For example, there can be a device such as a logic and central processing unit (CPU) merged with Dynamic Random Access Memory (DRAM) or Static Random Access Memory (SRAM).

In order to maintain the characteristics of different devices in one chip, it is required to fabricate the devices with the gate oxide films formed with different thicknesses. Even in a circuit device only integrated with identical devices such as DRAM or SRAM, it is desired to form the gate oxide films with different thicknesses so as to differentiate the operation voltages of the devices in one chip.

FIG. 1 shows a semiconductor device with 3 gate oxide films having different thicknesses fabricated according to a conventional method. Referring to FIG. 1, the method for forming the gate oxide films with different thicknesses will be described.

First, a gate oxide film 104 is formed on a high voltage region (A1), a middle voltage region (A2), and a low voltage region (A3) defined on a semiconductor substrate 100 by device isolation regions 102. Next, a photo resist film is formed on the first gate oxide film 104 and is patterned so as to expose the middle and low voltages regions A2 and A3. Then, the gate oxide film is removed on the middle and low voltages regions A2 and A3 using the photoresist as a mask so as to form the gate oxide film 104 only in the high voltage region A1.

Next, after removing the photoresist film, an annealing process is performed on the semiconductor substrate 100 so as to form a second gate oxide film. At this time, the second gate oxide film is formed thinner than the gate oxide film 104 for the high voltage region A1. Next, the second gate oxide film is patterned through photolithography so as to form a gate oxide film 106 only in the middle voltage region A2.

Finally, a gate oxide film 108 for the low voltage region is formed by oxidizing the semiconductor substrate 100, the gate oxide film 108 being formed thinner than the second gate oxide film.

However, the conventional method has a drawback in that the gate oxide films are formed through multiple etch processes such that the dielectric material of the device isolation regions 102, which has little etch selectivity with the gate oxide films 104, 106, and 108, is partially removed. Thus, the gate oxide films are damaged, causing the semiconductor devices to operate in a faulty manner, such as breaking down.

SUMMARY OF THE INVENTION

The present invention has been made in an effort to solve the above problem, and it is an object of the present invention to provide a method for fabricating a semiconductor device, which is capable of minimizing the damage to the device isolation region while forming the gate oxide films with different thicknesses.

In order to achieve the above object, the semiconductor device fabrication method of the present invention may include forming a nitride layer as an etching mask.

The method for fabricating a semiconductor device includes defining a first, a second, and a third device region by forming device isolation regions on a semiconductor substrate, forming a sacrificing dielectric layer on the substrate, removing the sacrificing dielectric layer on the first device region by selective etching, forming a first gate oxide layer by oxidizing the first device region, removing the sacrificing dielectric layer on the second and third device regions, forming a second gate oxide layer on the second and third device region by oxidizing the substrate, forming a photoresist pattern exposing the third device region and covering the first and second device regions, and forming a third gate oxide layer by oxidizing the third device region.

In an exemplary embodiment, the first to third gate oxide layers have different thicknesses.

In an exemplary embodiment, the first gate oxide layer is thicker than the second gate oxide layer, and the second gate oxide layer is thicker than the third gate oxide layer.

In an exemplary embodiment, the sacrificing dielectric layer is formed by depositing silicon nitride.

In an exemplary embodiment, the method further includes forming an oxide layer on the nitride layer by depositing silicon oxide.

In an exemplary embodiment, the nitride layer is formed with a thickness less than or equal to 100 Å.

In an exemplary embodiment, the oxide layer is formed with a thickness less than or equal to 150 Å.

In an exemplary embodiment, the sacrificing nitride layer is removed using a wet etching technique.

In an exemplary embodiment, the oxide layer is removed using a dry etching technique.

It is to be understood that both the foregoing general description of the invention and the following detailed description are exemplary, but are not restrictive of the invention.

DETAILED DESCRIPTION OF THE INVENTION

Figure 1:
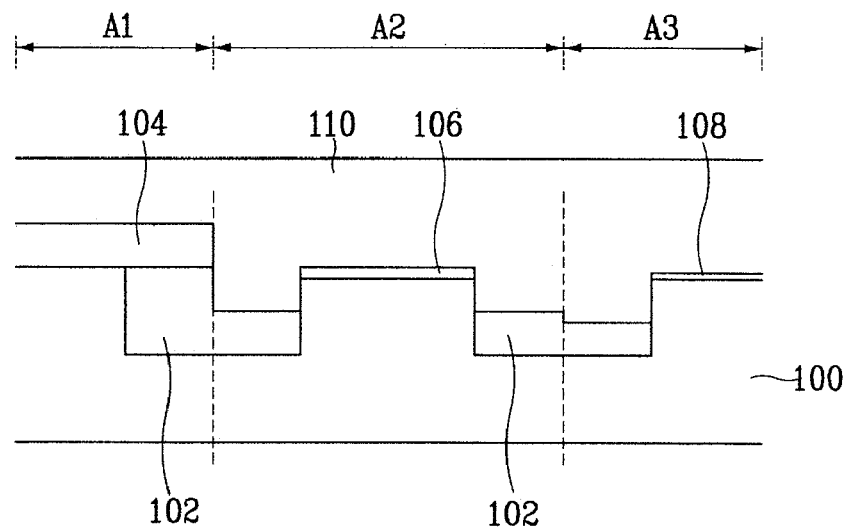
FIG. 1 shows a semiconductor device according to a conventional method.

With reference to the accompanying drawings, the present invention will be described in order for those skilled in the art to be able to implement it. However, the invention is not limited to the embodiments to be described hereinafter, but, to the contrary, is intended to cover various modifications and equivalent arrangements included within the sprit and scope of the appended claims.

To clarify multiple layers and regions, the thickness of the layers are enlarged in the drawings. Wherever possible, the same reference numbers will be used throughout the drawing(s) to refer to the same or like parts. When it is said any part such as a layer, film, area, or plate is positioned "on" another part, it means the part is right on the other part or above the other part with at least one intermediate part. Further, when it is said that any part is positioned "right on" another part, it means that there is no intermediate part between the two parts (i.e. the parts are in direct contact).

A semiconductor device according to an exemplary embodiment of the present invention will be described hereinafter with reference to the accompanying drawings.

Figure 2:
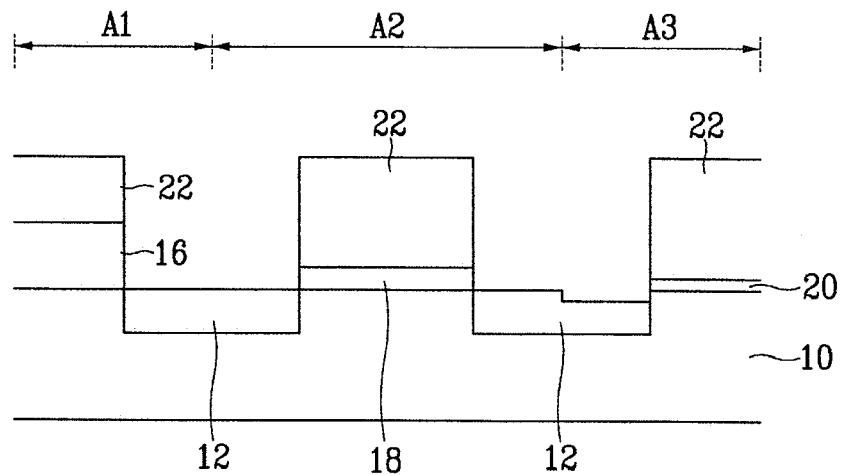
FIG. 2 is a cross sectional view schematically illustrating the semiconductor device according to the preferred embodiment of the present invention.

FIG. 2 is a cross sectional view schematically illustrating the semiconductor device according to an exemplary embodiment of the present invention.

Referring to FIG. 2, active regions at which semiconductor devices to be arranged are defined on a semiconductor substrate 10 such as silicon by device isolation regions 12. The active regions defined by the device isolation regions 12 are divided into first to third device regions (A1-A3) operated under different voltages.

Source regions and drain regions (not shown) are formed by doping conductive impurity ions at a high concentration level in the device regions A1 to A3. Channel regions (not shown) are formed between pairs of the source and drain regions. The channel regions are formed of intrinsic semiconductor material, without doping the conductive impurity thereinto. Also, low doping concentration regions (not shown) are formed by doping the conductive impurity at a low concentration level.

On the semiconductor substrate 10, gates 22 including respective gate oxide films 16, 18, and 20 and polycrystalline silicon layers are formed so as to be partially overlapped with the channel regions. The gate oxide films 16, 18 and 20 below the respective gates 22 are formed with different thicknesses for differentiating the input voltage, such that the first device region A1 is operated by a high voltage, the second device region A2 is operated by a middle voltage, and the third device region A3 is operated by a low voltage. Accordingly, the thicknesses of the gate oxide films become thinner going from the first device region A1 to the third device region A3.

A method for fabricating the above structured semiconductor device according to an exemplary embodiment of the present invention will be described hereinafter with reference to the accompanying drawings.

FIG. 3 to FIG. 7 are cross-sectional views illustrating fabrication steps for the semiconductor device according to an exemplary embodiment of the present invention.

Figure 3:
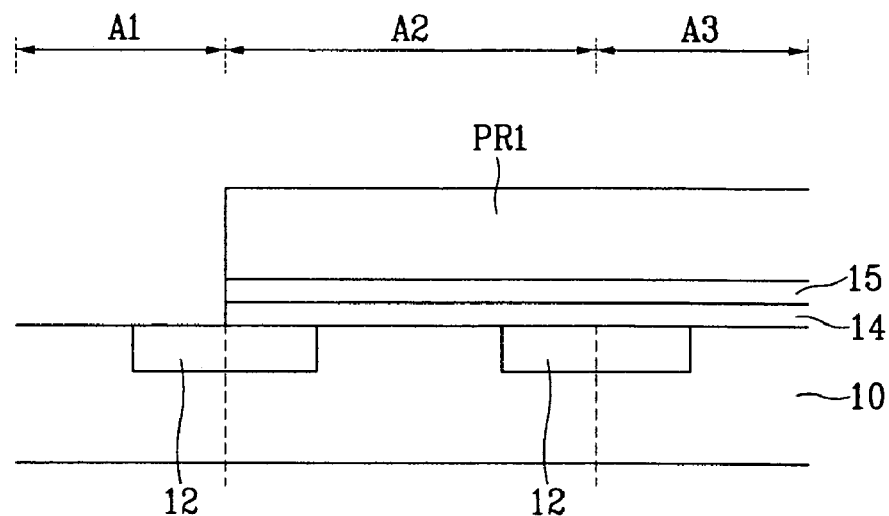
FIG. 3 to FIG. 7 are cross-sectional views illustrating fabrication steps for the semiconductor device according to the preferred embodiment of the present invention.

Referring to FIG. 3, the device isolation regions 12 defining the active regions are formed on the semiconductor substrate 10 using a shallow trench isolation (STI) technique. In the STI technique, the device isolation region 12 is completed by forming a trench at a predetermined region of the substrate and then filling the trench with a dielectric material.

For convenience of explanation, it is noted that the high voltage region is the first device region (A1), the middle voltage region is the second device region (A2), and the low voltage region is the third device region (A3).

Next, ions for adjusting threshold voltages, ions for adjusting punchthrough, ions for channel stop, and ions for forming wells (not shown) that are N type or P type are injected into the substrate in sequential order. A thermal treatment process is performed for activating the injected impurity ions.

Next, a sacrificing nitride layer 14 is formed on the substrate 10 by depositing silicon nitride using a chemical vapor deposition (CVD) technique, and a sacrificing oxide layer 15 is formed by deposing silicon oxide using an in-situ process. The sacrificing nitride layer 14 is formed with a thickness less than or equal to 100 Å, and the sacrificing oxide layer 15 is formed with a thickness less than or equal to 150 Å.

In a case where the sacrificing nitride layer 14 is removed with a wet etch technique, the sacrificing oxide layer 15 may be formed. However, in a case of using a dry etch technique, the sacrificing oxide 15 may not be formed.

Next, a photoresist pattern (PR1) exposing the sacrificing oxide layer 15 of the first device region (A1) is formed on the sacrificing oxide layer 15.

After forming the photoresist pattern, the sacrificing oxide layer 15 and the sacrificing nitride layer 14 of the first device region are removed using the photoresist pattern (PR1) as a mask such that the substrate of the high voltage region (A1) and the device isolation region are selectively exposed.

Figure 4:
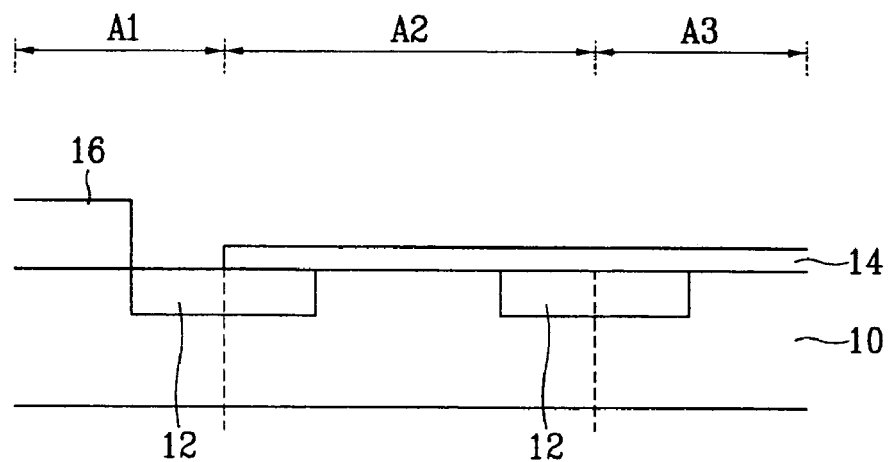

Referring to FIG. 4, the photoresist pattern (PR1) and the sacrificing oxide layer 15 of the middle voltage region (A2) and the low voltage region (A3) are removed.

Next, the first gate oxide layer 16 is formed at the first device region A1 through a thermal treatment process. At this time, the first gate oxide layer 16 is formed with a thickness less than or equal to 1,000 Å. No gate oxide layer is formed on the middle voltage region A2 and the low voltage region (A3) due to the remaining sacrificing nitride layer 13.

Figure 5:
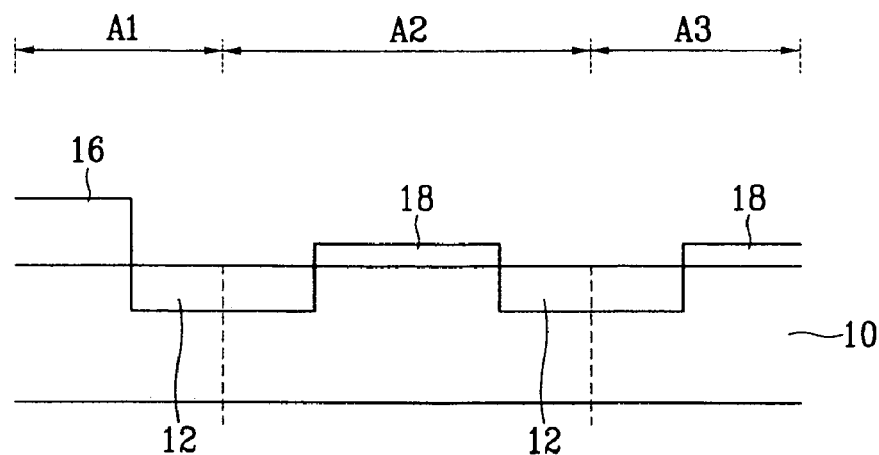

Referring to FIG. 5, the sacrificing nitride layer 14 on the second and third device regions A2 and A3 is removed. The second gate oxide layer 18 is formed on the second device region A2 by performing an oxidization process. At this time, the third device region A3 is exposed such that the oxide layer is formed thereon together with the second device region. Here, the second gate oxide layer 18 is formed with a thickness less than or equal to 130 Å.

Figure 6:
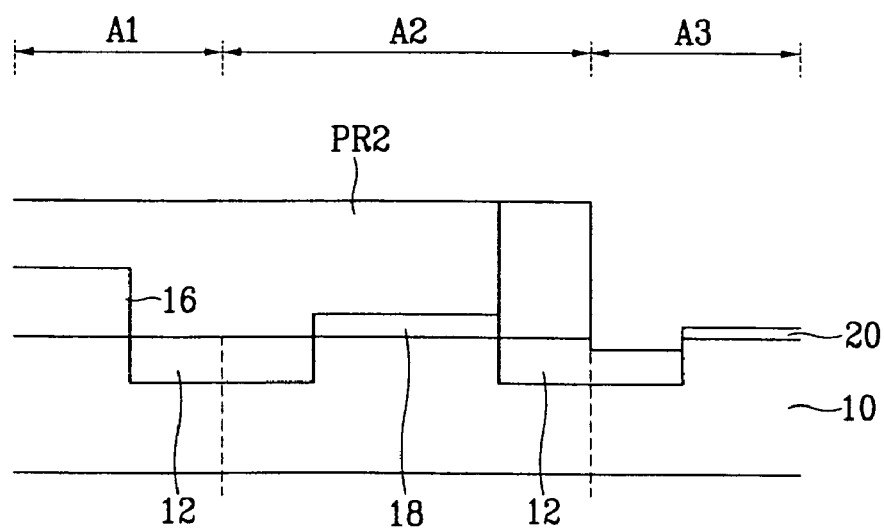

Referring to FIG. 6, the photoresist pattern (PR2) exposing the third device region A3 is formed on the substrate 10. And then the third gate oxide layer 20 is formed on the third device region A3 by oxidizing the substrate 10.

The third gate oxide layer 20 is formed with a thickness less than or equal to 30 Å.

Figure 7:
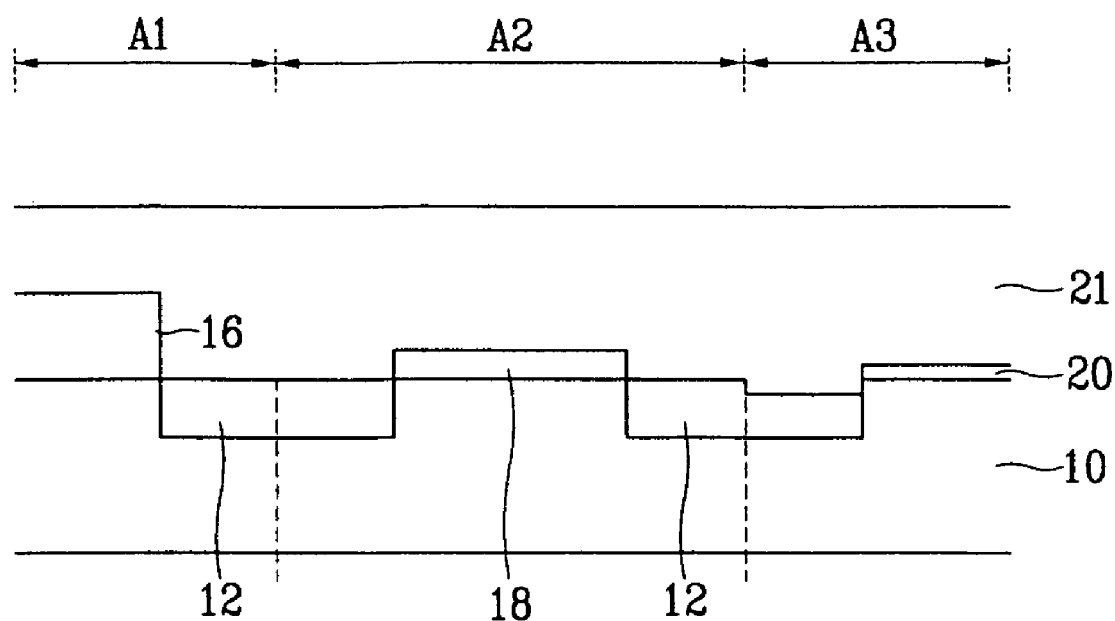

Referring to FIG. 7, the polycrystalline silicon layer 21 for the gate is formed by depositing polycrystalline silicon on the substrate 10. Next, as shown in FIG. 2, the polycrystalline silicon layer 21 is selectively etched to be patterned so as to form the gate 22 on the respective device regions.

As described above, when the high voltage region is oxidized, other regions are protected by the nitride layer such that the oxide layer is selectively formed only on the high voltage region. Thus, it is possible to prevent the device isolation regions from being damaged by patterning the oxide layer.

Accordingly, using nitride layers as in the present invention forms different thickness gate oxide layers and minimizes the loss of the dielectric material at the device isolation regions, such that it is possible to minimize defects, such as reduction of the internal pressure.

As described above, using the nitride layers it is possible to form the gate oxide layers with different thicknesses while minimizing the loss of the dielectric material at the device isolation regions. This minimizes the occurrence of defects such as breakdown, resulting in enhancement of device reliability.

Korean Patent Application No. 10-2003-0101931, filed on Dec. 31, 2003, is incorporated herein by reference in its entirety.

Although exemplary embodiments of the present invention have been described in detail hereinabove, it should be clearly understood that many variations and/or modifications of the basic invention concepts herein taught which may appear to those skilled in the present art will still fall within the spirit and scope of the present invention, as defined in the appended claims.

What is claimed is:

1. A method for forming gate oxide layers of a semiconductor device, comprising steps of:
   defining a first, a second, and a third device region by forming device isolation regions on a semiconductor substrate;
   forming a sacrificing dielectric layer on the substrate;
   removing the sacrificing dielectric layer on the first device region by selective etching;
   forming a first gate oxide layer by oxidizing the first device region;
   removing the sacrificing dielectric layer on the second and third device regions;
   forming a second gate oxide layer on the second and third device regions by oxidizing the substrate;
   removing the second gate oxide layer on the third device region;
   forming a photoresist pattern exposing the third device region and covering the first and second device regions; and
   forming a third gate oxide layer by oxidizing the third device region.

2. The method of claim 1, wherein the first to third gate oxide layers have different thicknesses.

3. The method of claim 2, wherein the first gate oxide layer is thicker than the second gate oxide layer, and the second gate oxide layer is thicker than the third gate oxide layer.

4. The method of claim 1, wherein the step of forming a sacrificing dielectric layer includes forming a nitride layer by depositing silicon nitride.

5. The method of claim 4, further comprising forming an oxide layer on the nitride layer by depositing silicon oxide.

6. The method of claim 4, wherein the nitride layer is formed with a thickness less than or equal to 100 Å.

7. The method of claim 5, wherein the oxide layer is formed with a thickness less than or equal to 150 Å.

8. The method of claim 4, wherein the nitride layer is removed using a wet etching technique.

9. The method of claim 5, wherein the oxide layer is removed using a dry etching technique.

10. A method for forming gate oxide layers of a semiconductor device, comprising steps of:
    a step for defining a first, a second, and a third device region by forming device isolation regions on a semiconductor substrate;
    a step for forming a sacrificing dielectric layer on the substrate;
    a step for removing the sacrificing dielectric layer on the first device region by selective etching; a step for forming a first gate oxide layer by oxidizing the first device region;
    a step for removing the sacrificing dielectric layer on the second and third device regions;
    a step for forming a second gate oxide layer on the second and third device region by oxidizing the substrate;
    a step of removing the second gate oxide layer on the third device region;
    a step for forming a photoresist pattern exposing the third device region and covering the first and second device regions;
    a step for forming a third gate oxide layer by oxidizing the third device region
    a step of forming a polycrystalline silicon layer for a gate on the substrate; and
    a step of selectively etching the polycrystalline silicon layer to form gates on the respective device region.

11. The method of claim 10, wherein the first to third gate oxide layers have different thicknesses.

12. The method of claim 11, wherein the first gate oxide layer is thicker than the second gate oxide layer, and the second gate oxide layer is thicker than the third gate oxide layer.

13. The method of claim 10, wherein the step for forming a sacrificing dielectric layer includes a step for forming a nitride layer by depositing silicon nitride.

14. The method of claim 13, further comprising a step for forming an oxide layer on the nitride layer by depositing silicon oxide.

15. The method of claim 13, wherein the nitride layer is formed with a thickness less than or equal to 100 Å.

16. The method of claim 14, wherein the oxide layer is formed with a thickness less than or equal to 150 Å.

17. The method of claim 13, wherein the sacrificing nitride layer is removed using a wet etching technique.

18. The method of claim 14, wherein the oxide layer is removed using a dry etching technique.

* * * * *